US007315601B2

(12) United States Patent
Fontaine et al.

(10) Patent No.: US 7,315,601 B2
(45) Date of Patent: Jan. 1, 2008

(54) LOW-NOISE SIGMA-DELTA FREQUENCY SYNTHESIZER

(75) Inventors: Paul H. Fontaine, Richardson, TX (US); Abdellatif Bellaouar, Dallas, TX (US); Bertan Bakkaloglu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 844 days.

(21) Appl. No.: 10/387,848

(22) Filed: Mar. 13, 2003

(65) Prior Publication Data

US 2004/0179642 A1 Sep. 16, 2004

(51) Int. Cl.
*H03D 3/24* (2006.01)
*H03L 7/06* (2006.01)

(52) U.S. Cl. ............... 375/375; 375/376; 327/147; 327/156

(58) Field of Classification Search ............... 375/354, 375/355, 371–377; 327/91, 94, 95, 105, 327/141, 144, 147, 148, 155–157
See application file for complete search history.

(56) References Cited

U.S. PATENT DOCUMENTS

| 4,187,473 A | * | 2/1980 | Cochran | 331/8 |
|---|---|---|---|---|
| 4,290,028 A | * | 9/1981 | LeGrand | 331/1 A |
| 4,614,917 A | * | 9/1986 | Zelitzki et al. | 331/1 A |
| 4,668,922 A | * | 5/1987 | Crawford et al. | 331/1 A |
| 5,604,468 A | * | 2/1997 | Gillig | 331/176 |
| 5,818,303 A | * | 10/1998 | Oishi et al. | 331/1 A |
| 6,044,124 A | | 3/2000 | Monahan et al. | 375/376 |
| 6,396,313 B1 | * | 5/2002 | Sheen | 327/105 |
| 6,404,291 B1 | * | 6/2002 | Riley | 331/11 |
| 6,700,945 B2 | * | 3/2004 | Maeda | 375/376 |
| 6,704,383 B2 | * | 3/2004 | Lee et al. | 375/376 |
| 6,741,846 B1 | * | 5/2004 | Welland et al. | 455/260 |
| 2003/0001681 A1 | * | 1/2003 | Asikainen et al. | 331/18 |
| 2003/0078013 A1 | * | 4/2003 | Ferguson, Jr. | 455/85 |

* cited by examiner

*Primary Examiner*—Mohammed Ghayour
*Assistant Examiner*—Vineeta Panwalkar
(74) *Attorney, Agent, or Firm*—Dolly Y. Wu; W. James Brady; Frederick J. Telecky, Jr.

(57) ABSTRACT

A sample-and-hold (SAH) phase detector (PD) is clocked in such a way (using a reverse clocking mode) so as to avoid quantization noise increases due to folding that is generally associated with conventional charge pump based phase detectors. The PD is clocked with a clean clock (reference clock), rather than a divided clock. The SAH PD architecture additionally includes an integrated filtering function.

16 Claims, 2 Drawing Sheets

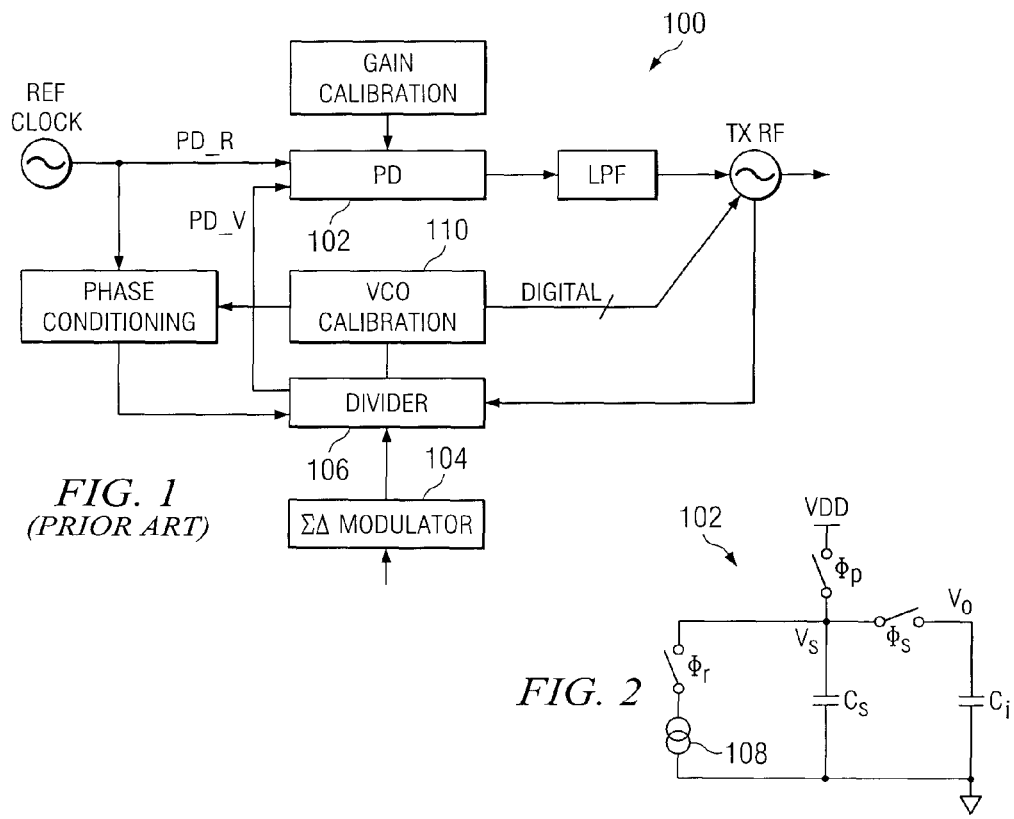
FIG. 1
(PRIOR ART)
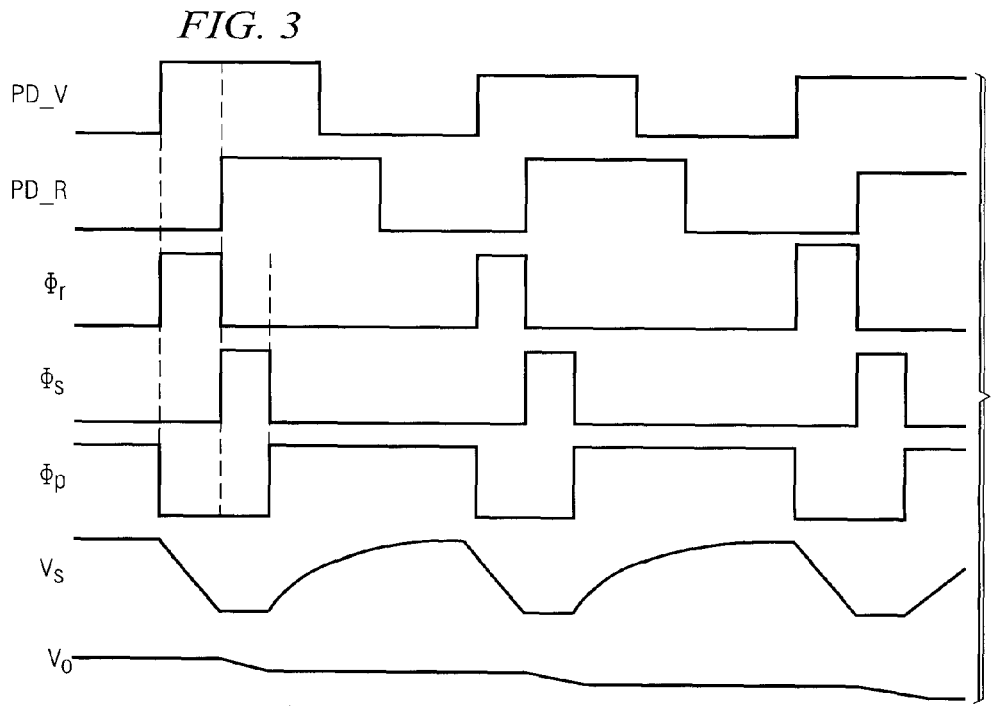
FIG. 2
FIG. 3

LOW-NOISE SIGMA-DELTA FREQUENCY SYNTHESIZER

BACKGROUND OF THE INVENTION

1. Field of the Invention

This invention relates generally to sigma-delta (ΣΔ) loops, and more particularly to a sample and hold (SAH) phase detector (PD) architecture and method of clocking to avoid quantization noise folding in ΣΔ loop applications such as a ΣΔ frequency synthesizer.

2. Description of the Prior Art

Conventional charge pump based phase detectors suffer several problems when they are used in ΣΔ loop applications. These problems may include, for example, noise folding due to non-linearity, charge/discharge mismatch, and the like.

In view of the foregoing, it is highly desirable and advantageous to provide a PD architecture and a PD clocking scheme that avoids quantization noise increases due to noise folding. It would be further advantageous if the PD architecture could provide an integrated filtering function.

SUMMARY OF THE INVENTION

The present invention is directed to a sample-and-hold (SAH) phase detector (PD) that is clocked in such a way so as to avoid quantization noise increases due to folding that is generally associated with conventional charge pump based phase detectors. The PD is clocked with a clean clock (e.g. reference clock generated by TXCO), rather than a divided VCO clock. The SAH PD architecture additionally includes an integrated filtering function.

According to one embodiment, a method of clocking a sample-and-hold (SAH) phase detector (PD) comprises the steps of precharging a ramp node to a supply voltage in response to a first clock; discharging the precharged ramp node via a linear current source in response to a second clock; and sampling this ramp node in response to a third clock such that the output node is maintained at a desired output voltage level during the third clock, wherein the second clock commences in response to a voltage controlled oscillator (VCO) clock edge, and further wherein the third clock commences in response to a reference clock edge, such that quantization noise folding associated with the SAH PD is substantially reduced below levels achievable using charge pump based phase detectors.

According to another embodiment, a method of clocking a sample-and-hold (SAH) phase detector (PD) comprises the steps of providing a stable reference clock operational to generate a reference clock edge and a voltage controlled oscillator (VCO) associated with a divider element operational to generate a VCO clock edge; and clocking the SAH PD in response to the reference buffer clock edge and the VCO clock edge such that quantization noise folding associated with the SAH PD is substantially reduced below levels achievable using a charge pump based PD.

According to yet another embodiment of the present invention, a sigma-delta frequency synthesizer comprises a stable reference clock operational to generate a reference clock edge; a voltage controlled oscillator (VCO) responsive to a divider element to generate a VCO clock edge; and a sample-and-hold (SAH) phase detector (PD) responsive to the reference buffer clock edge and the VCO clock edge to hold a sampling node voltage at a desired output voltage level during a sampling pulse such that quantization noise folding associated with the SAH PD is substantially reduced below levels achievable using a charge pump based PD.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIG. 1 is a block diagram illustrating a well known type-I frequency synthesizer;

FIG. 2 illustrates a sample and hold (SAH) phase detector (PD) suitable for use with the frequency synthesizer shown in FIG. 1;

FIG. 3 is a clock diagram associated with the PD shown in FIG. 2;

Figure 4:
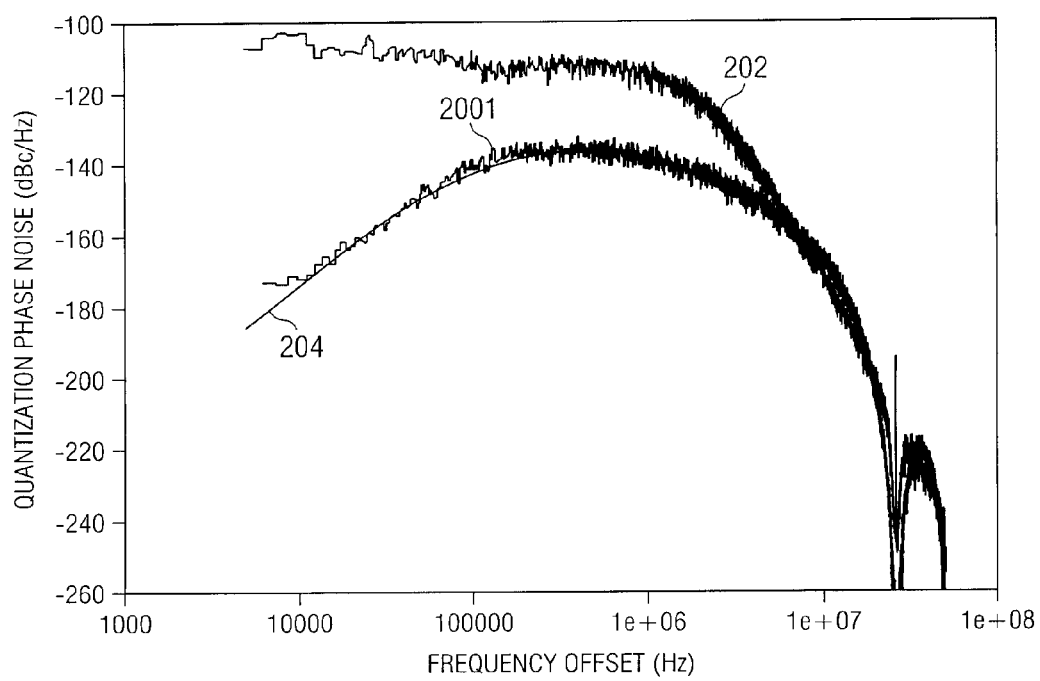
FIG. 4 is a quantization noise simulation plot associated with the frequency synthesizer shown in FIG. 1 that employs the PD shown in FIG. 2 which is clocked as shown in FIG. 3.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

FIG. 1 is a system block diagram illustrating a typical type-I frequency synthesizer architecture 100. The present inventors recognized the design of the phase detector (PD) 102 for ΣΔ high performance frequency synthesizers is key to low noise applications. Regarding frequency synthesizer architecture 100, the ΣΔ modulator 104 generates the fractional channel for the divider 106 by randomly changing the divider 106 ratio between different values. For a ΣΔ modulator using one known architecture, for example, the divider 106 changes between a maximum of N+4 and a minimum of N−3 wherein N is an integer of value 4 or greater. These variations are problematic however, in that they cause what is commonly referred to as quantization noise which can increase the total output noise of the frequency synthesizer 100.

The present inventors also recognized that type-II phase locked loops (PLLs) using charge pump based phase detectors are problematic in that they can suffer high quantization noise due to the non-linearity of the PD and the mismatch between the up and down currents. The synthesizer architectures discussed herein with reference to the particular embodiments are then most preferably using type-I PLLs. These type-I PLLs, according to the most preferred embodiments, are based on sample and hold (SAH) phase detectors (PDs) that do not rely on charge pumps. Such SAH PDs provide good linearity without suffering the problems associated with current mismatch as in the conventional PDs based on charge pumps. The most preferred embodiments are now discussed herein below with reference to FIGS. 2-5 to describe a clocking scheme for a SAH PD that avoids the problems of quantization noise folding while providing inherent filtering characteristics.

FIG. 2 illustrates a simplified circuit structure for a sample and hold (SAH) phase detector (PD) 102. Operation of this PD commences when the node $V_s$ is initially precharged to VDD through the clock $\phi_p$. When the reference edge, depicted as (PD_R in FIG. 1), coming from the reference buffer reaches the PD 102, it generates a clock $\phi_r$ to discharge the node $V_s$ via a linear current source 108. When the VCO edge, depicted as (PD_V in FIG. 1), reaches the PD 102, it stops $\phi_r$ and generates a small pulse $\phi_s$ to sample the voltage on the node $V_s$ and hold it at $V_o$. Since the clock PD_V is jittery due to the division variation with time, the output $V_o$ is affected by this jitter; and hence total output noise increases.

Recognizing the foregoing adverse quantization noise characteristics associated with a SAH PD, the present inventors implemented a reversed clocking scheme to substantially reduce the noise impact. With continued reference to FIG. 2, this reversed clocking scheme advantageously generates the phase $\phi_r$ by the clock PD_V rather than by the clock PD_R; and further generates the phase $\phi_s$ by the clock PD_R rather than by the clock PD_V. This change was found by the present inventors to yield a very clean sampling pulse $\phi_s$ since it is now generated via the temperature compensated crystal oscillator (TCXO) buffer contained within VCO Calibration block 110. Because a crystal oscillator and the reference buffer inherently have low phase noise, the output $V_o$ is much cleaner.

FIG. 3 is a clock diagram associated with the SAH PD architecture shown in FIG. 2 according to one embodiment of the present invention that employs the reversed clocking scheme discussed herein before.

FIG. 4 is a quantization noise plot simulation associated with the frequency synthesizer 100 shown in FIG. 1 that employs the SAH PD shown in FIG. 2 which is reverse clocked as shown in FIG. 3. The quantization noise is plotted using the reverse clocking scheme 200 and also using the conventional clocking scheme 202 that is known in the art. The quantization noise plots clearly demonstrate that the noise folding is avoided in the new reverse clocking scheme 200 compared to the conventional clocking scheme 202.

Equation (1) below represents the theoretical quantization noise of the frequency synthesizer 100 where no noise folding is occurring.

$$\mathcal{L}(f) = \frac{F_{ref}}{12f^2}\left(2\sin\left(\frac{\pi f}{F_{ref}}\right)\right)^6 |H(f)|^2, \quad (1)$$

where $F_{ref}$ is the reference clock (e.g. 26 MHz), $f$ is the frequency offset, and $H(f)$ is the transfer function of the loop from the divider 106 control point. This theoretical quantization noise is depicted by the continuous arcuate plot 204 in FIG. 4.

The present inventors further discovered another advantage associated with the SAH PD using the reverse clocking scheme is provided in association with the inherent pole caused by the charge sharing between the two capacitors $C_s$ and $C_i$ seen in FIG. 2. This inherent pole is represented by the time constant shown as equation (2) below.

$$\frac{C_i + C_s/2}{C_s F_{ref}} \quad (2)$$

This means that the PLL extra free pole is determined by capacitor ratio and is independent of process variations. This pole can then be accurately controlled simply via correct capacitor sizing and selecting a desired capacitor ratio.

Figure 5:
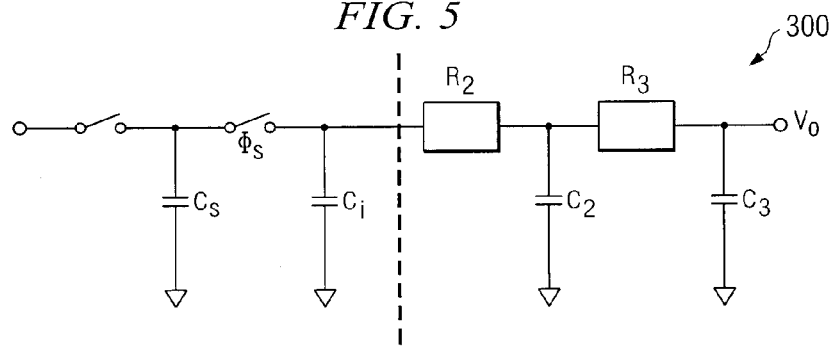
FIG. 5 illustrates another sample and hold (SAH) phase detector (PD) suitable for use with the frequency synthesizer shown in FIG. 1.

If more filtering is desired for the loop, than the SAH PD can drive an RC network 300 such as shown in FIG. 5 without additional buffering. FIG. 5 illustrates a sample and hold (SAH) phase detector (PD) suitable for use with the frequency synthesizer 100 shown in FIG. 1 according to another embodiment of the present invention. The first pole for the SAH PD depicted in FIG. 5 is given in equation (3) below as $$\frac{C_s/2 + C_2 + C_3}{C_s F_s} + R_2(C_2 + C_3) + R_3 C_3. \quad (3)$$

By making the switched capacitor term $C_s$ more dominant, overall response is then less sensitive to process variations.

In summary explanation, a sample-and-hold (SAH) phase detector (PD) is clocked in such a way (using a reverse clocking mode) so as to avoid quantization noise increases due to folding that are generally associated with conventional charge pump based phase detectors. The PD is clocked with a clean clock (reference clock), rather than a divided clock. The SAH PD architecture additionally inherently includes an integrated filtering function.

In view of the above, it can be seen the present invention presents a significant advancement in the art of phase detector clocking schemes and associated methods. This invention has been described in considerable detail in order to provide those skilled in the ΣΔ frequency synthesizer art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of clocking a sample-and-hold (SAH) phase detector (PD), the method comprising the steps of:
   precharging a ramp node to a supply voltage in response to a first clock;
   discharging the precharged ramp node via a linear current source in response to a second clock; and
   sampling the discharging precharged ramp node in response to a third clock such that the ramp node is maintained at a desired output voltage level during the third clock, wherein the second clock commences in response to a voltage controlled oscillator (VCO) clock edge, and further wherein the third clock commences in response to a reference clock edge, such that quantization noise folding associated with the SAH PD is substantially reduced below levels achievable using charge pump based phase detectors.

2. The method according to claim 1 wherein the SAH PD is not associated with a charge pump.

3. The method according to claim 1 wherein the SAH PD is associated with a sigma-delta frequency synthesizer comprising a type-I phase locked loop (PLL).

4. The method according to claim 1 wherein the SAH PD is associated with a sigma-delta frequency synthesizer comprising:
   a temperature compensated crystal oscillator (TCXO) configured to generate the reference clock edge; and
   a voltage controlled oscillator (VCO) associated with a divider element configured to generate the VCO clock edge.

5. A method of clocking a sample-and-hold (SAH) phase detector (PD), the method comprising the steps of:
   providing a stable reference clock operational to generate a reference clock edge and a voltage controlled oscillator (VCO) associated with a divider element operational to generate a VCO clock edge;
   clocking the SAH PD in response to the reference clock edge and the VCO clock edge such that quantization noise folding associated with the SAH PD is substantially reduced below levels achievable using a charge pump based PD;
   wherein a $\phi r$ and a $\phi s$ phase clock, used for clocking the SAH PD, are generated based on a first lead edge of the VCO clock edge and a second lead edge of the reference clock edge, respectively; and $\phi s$ is for sampling a voltage and holding the voltage on a capacitor circuit; and $\phi r$ is for discharging the capacitor circuit so the voltage is no longer held.

6. The method according to claim 5 wherein the stable reference clock comprises a temperature compensated crystal oscillator (TCXO).

7. A method of clocking a sample-and-hold (SAH) phase detector (PD), the method comprising the steps of:
   providing a stable reference clock operational to generate a reference clock edge and a voltage controlled oscillator (VCO) associated with a divider element operational to generate a VCO clock edge; and
   clocking the SAH PD in response to the reference clock edge and the VCO clock edge such that quantization noise folding associated with the SAH PD is substantially reduced below levels achievable using a charge pump based PD;
and wherein the step of clocking the SAH PD comprises the steps of:
   precharging a ramp node to a supply voltage in response to a first clock;
   discharging the precharged ramp node via a linear current source in response to a second clock; and
   sampling the discharging precharged ramp node in response to a third clock such that the ramp node is maintained at a desired output voltage level during the third clock, wherein the second clock commences in response to the reference clock edge.

8. The method according to claim 7 wherein the stable reference clock comprises a temperature compensated crystal oscillator (TCXO).

9. A sigma-delta frequency synthesizer comprising:
   a stable reference clock operational to generate a reference clock edge;
   a voltage controlled oscillator (VCO) responsive to a divider element to generate a VCO clock edge; and
   a sample-and-hold (SAH) phase detector (PD) responsive to the reference clock edge and the VCO clock edge to hold a sampling node voltage at a desired output voltage level during a sampling pulse such that quantization noise folding associated with the SAH PD is substantially reduced below levels achievable using a charge pump based PD; and
   wherein the SAH PD comprises a switched capacitor circuit operational to provide one additional phased locked loop (PLL) pole due to charge sharing between two SAH PD capacitors.

10. The sigma-delta frequency synthesizer according to claim 9 further comprising a sigma-delta modulator operational to randomly change a divider ratio associated with the divider element to generate a fractional channel for the divider element.

11. The sigma-delta frequency synthesizer according to claim 9, wherein the stable reference clock comprises a temperature compensated crystal oscillator (TCXO).

12. The sigma-delta frequency synthesizer according to claim 9, wherein the additional PLL pole is represented by $(C_i+C_s/2)/C_s F_{ref}$, where $C_i$ and $C_s$ are capacitive elements associated with the SAH PD and $F_{ref}$ is the reference clock.

13. The sigma-delta frequency synthesizer according to claim 9, wherein the SAH PD further comprises an RC ladder network filter driven directly by the switched capacitor circuit to provide a desired increased level of filtering.

14. A sigma-delta frequency synthesizer comprising:
   a stable reference clock operational to generate a reference clock edge:
   a voltage controlled oscillator (VCO) responsive to a divider element to generate a VCO clock edge; and
   a sample-and-hold (SAH) phase detector (PD) responsive to the reference clock edge and the VCO clock edge to hold a sampling node voltage at a desired output voltage level during a sampling pulse such that quantization noise folding associated with the SAH PD is substantially reduced below levels achievable using a charge pump based PD, wherein the SAH PD comprises:
   a sampling node;
   a linear current source;
   a precharging clock circuit operational to precharge the sampling node to a supply voltage level;
   a discharging clock circuit operational to discharge the precharged sampling node via the linear current source; and
   a sampling clock circuit operational to sample the discharging precharged sampling node such that the sampling node is maintained at a desired output voltage level during a sampling clock period, wherein the precharging clock commences in response to the VCO clock edge, and further wherein the sampling clock period commences in response to the reference clock edge.

15. The sigma-delta frequency synthesizer according to claim 14 further comprising a sigma-delta modulator operational to randomly change a divider ratio associated with the divider element to generate a fractional channel for the divider element.

16. The sigma-delta frequency synthesizer according to claim 14, wherein the stable reference clock comprises a temperature compensated crystal oscillator (TCXO).

* * * * *